(12) United States Patent
Nakayama et al.

(10) Patent No.: US 12,154,826 B2
(45) Date of Patent: *Nov. 26, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Masanori Nakayama, Toyama (JP); Katsunori Funaki, Toyama (JP); Tatsushi Ueda, Toyama (JP); Yasutoshi Tsubota, Toyama (JP); Yuichiro Takeshima, Toyama (JP); Hiroto Igawa, Toyama (JP); Yuki Yamakado, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/306,798

(22) Filed: Apr. 25, 2023

(65) Prior Publication Data

US 2023/0307295 A1  Sep. 28, 2023

Related U.S. Application Data

(63) Continuation of application No. 16/817,508, filed on Mar. 12, 2020, now Pat. No. 11,664,275, which is a
(Continued)

(30) Foreign Application Priority Data

Sep. 28, 2017 (JP) .................. 2017-187994

(51) Int. Cl.
*H01L 21/321* (2006.01)
*H01L 21/67* (2006.01)
*H01L 21/768* (2006.01)

(52) U.S. Cl.
CPC ...... *H01L 21/76886* (2013.01); *H01L 21/321* (2013.01); *H01L 21/67115* (2013.01); *H01L 21/76862* (2013.01)

(58) Field of Classification Search
CPC .............. H01L 21/321; H01L 21/3205; H01L 21/47635; H01L 21/76838;
(Continued)

(56) References Cited

U.S. PATENT DOCUMENTS 5,723,367 A  3/1998 Wada
6,130,397 A  10/2000 Arai
(Continued)

FOREIGN PATENT DOCUMENTS

JP  05-021387 A  1/1993
JP  11-145148 A  5/1999
(Continued)

OTHER PUBLICATIONS

International Search Report, PCT/JP2018/035216, Nov. 6, 2018, 2 pgs.
(Continued)

*Primary Examiner* — Eduardo A Rodela
(74) *Attorney, Agent, or Firm* — Volpe Koenig

(57) ABSTRACT

There is provided a technique that includes: preparing the substrate including a silicon-containing film and a metal film composed of a metal element, which includes at least one selected from the group of tungsten, titanium, ruthenium, and molybdenum and, which are formed on a surface of the substrate; and simultaneously performing modifying the metal film and modifying the silicon-containing film by
(Continued)

supplying reactive species, which are generated by plasma-exciting a processing gas containing hydrogen and oxygen, to the substrate.

18 Claims, 8 Drawing Sheets

Related U.S. Application Data continuation of application No. PCT/JP2018/035216, filed on Sep. 21, 2018.

(58) Field of Classification Search
CPC ......... H01L 21/76853; H01L 21/76856; H01L 21/76864; H01L 21/76883; H01L 21/76886; H01L 21/76892
See application file for complete search history.

(56) References Cited

U.S. PATENT DOCUMENTS

| | | | |
|---|---|---|---|
| 9,070,749 B2* | 6/2015 | Kang | .................. C23C 16/18 |
| 11,664,275 B2* | 5/2023 | Nakayama | ........ H01L 21/76886 |
| | | | 438/798 |
| 2005/0260527 A1* | 11/2005 | Lee | ..................... G03F 7/2024 |
| | | | 430/311 |
| 2008/0020934 A1* | 1/2008 | Yoshii | ................... C23C 16/18 |
| | | | 257/E21.582 |
| 2009/0311876 A1 | 12/2009 | Terasaki | |
| 2010/0301480 A1* | 12/2010 | Choi | .................... H10N 70/828 |
| | | | 257/773 |
| 2011/0011148 A1* | 1/2011 | Chen | ........................ B44C 1/20 |
| | | | 72/352 |
| 2012/0161218 A1 | 6/2012 | Niitsuma et al. | |
| 2013/0224396 A1 | 8/2013 | Furusho | |
| 2013/0224965 A1 | 8/2013 | Sasaki et al. | |
| 2014/0061931 A1 | 3/2014 | Kang | |
| 2015/0228491 A1 | 8/2015 | Kang | |
| 2021/0082724 A1 | 3/2021 | Xie | |
| 2021/0104504 A1 | 4/2021 | Yonkee | |

FOREIGN PATENT DOCUMENTS

| | | |
|---|---|---|
| JP | 2010-232240 A | 10/2010 |
| JP | 2011-023730 A | 2/2011 |
| JP | 2012-151435 A | 8/2012 |
| JP | 2013-182961 A | 9/2013 |
| JP | 2014-032986 A | 2/2014 |
| KR | 10-2014-0067956 A | 6/2014 |
| WO | 2012/060325 A1 | 5/2012 |

OTHER PUBLICATIONS

Written Opinion issued on Sep. 14, 2020 for Singapore Patent Application No. 11202002212Y.
Korean Office Action issued on Sep. 29, 2021 for Korean Patent Application No. 10-2020-7007002.

* cited by examiner

FIG. 6

| W grain size (nm) | (A) Reference | (B) 100% | (C) 80% | (D) 65% |
|---|---|---|---|---|
| Minimum value | 4 | 8 | 9 | 9 |
| Maximum value | 18 | 25 | 46 | 47 |
| Average value | 10 | 15 | 19 | 21 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a continuation of U.S. patent application Ser. No. 16/817,508, filed on Mar. 12, 2020, which is a Bypass Continuation Application of PCT International Application No. PCT/JP2018/035216, filed on Sep. 21, 2018, which claims the benefit of priority to Japanese Application No 2017-187994, filed on Sep. 28, 2017, the entire contents of which are incorporated herein by reference.

TECHNICAL FIELD

The present disclosure relates to a method of manufacturing a semiconductor device, a substrate processing apparatus, and a recording medium.

BACKGROUND

There is an increasing demand for improved film quality of metal-containing films applied to electrodes and the like constituting devices such as DRAMs and flash memories. In the related art, there is disclosed techniques for suppressing an increase in a sheet resistance value of a titanium nitride (TiN) film using plasma of a gas containing oxygen and hydrogen.

The present disclosure provides a technique of modifying a metal film formed on a substrate such that the metal film has excellent characteristics applicable to an electrode and the like.

SUMMARY

According to an embodiment of the present disclosure, there is provided a technique, which includes: loading a substrate having a metal film composed of a single metal element formed on a surface of the substrate into a process chamber; generating reactive species by plasma-exciting a processing gas containing hydrogen and oxygen; and modifying the metal film by supplying the reactive species to the substrate, wherein in the act of modifying the metal film, the metal film is modified such that a crystal grain size of the metal element constituting the metal film is larger than that before performing the act of modifying the metal film.

BRIEF DESCRIPTION OF DRAWINGS

FIG. 6 is a table showing minimum values, maximum values and average values of W crystal grain sizes in a case where a plasma process according to an embodiment of the present disclosure is not performed and a case where a flow rate ratio of $H_2$ gas in a reaction gas is 100%, 80% and 65% in the plasma process according to the embodiment of the present disclosure.

DETAILED DESCRIPTION

Figure 1:
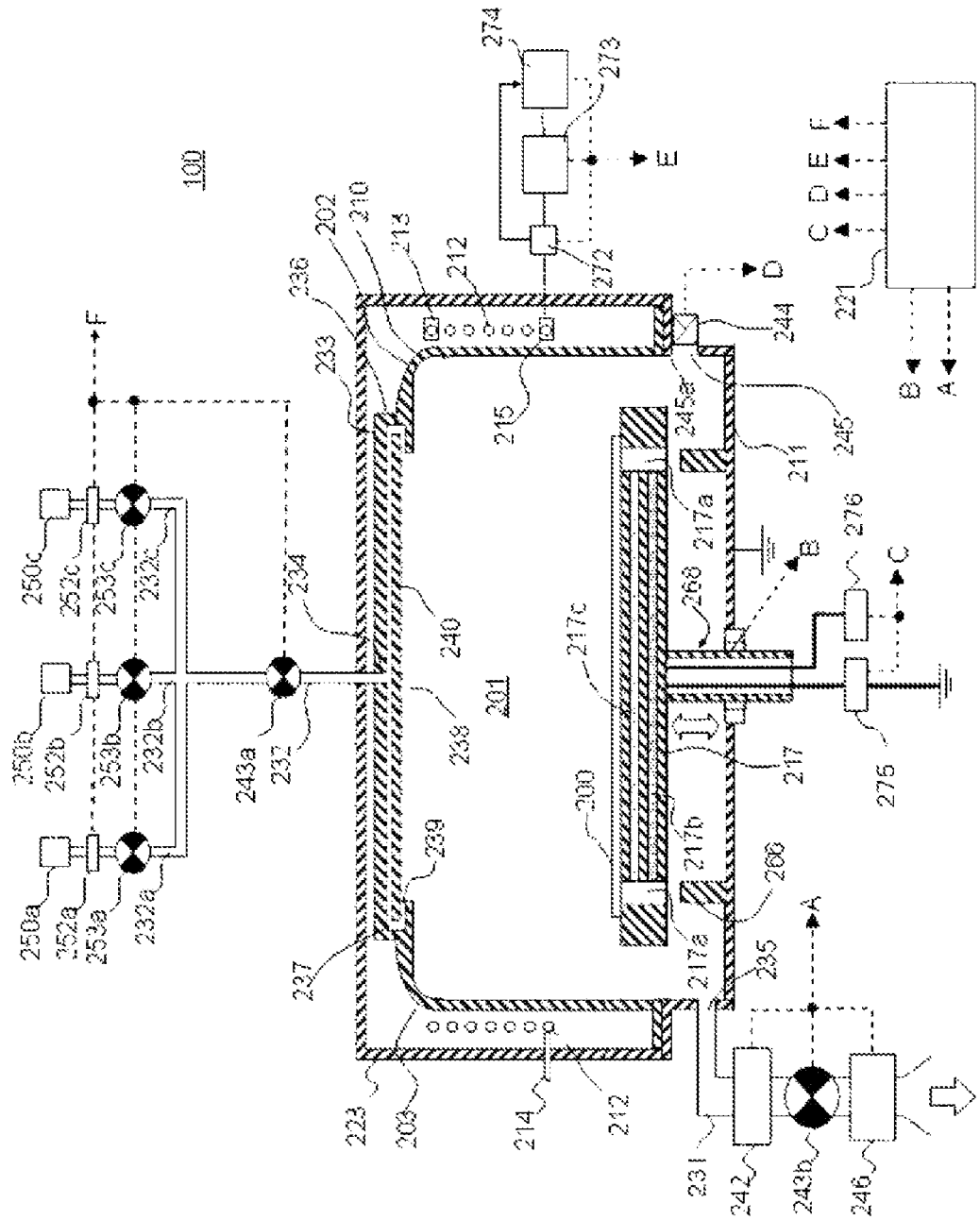
FIG. 1 is a sectional view of a substrate processing apparatus according to an embodiment of the present disclosure.

First Embodiment of the Present Disclosure (1) Configuration of Substrate Processing Apparatus A substrate processing apparatus according to a first embodiment of the present disclosure will now be described with reference to FIGS. 1 to 3.

(Process Chamber)

The processing apparatus 100 includes a process furnace 202 in which a plasma process is performed on a wafer 200. A process container 203 constituting a process chamber 201 is installed in the process furnace 202. The process container 203 includes a dome-shaped upper container 210 as a first container, and a bowl-shaped lower container 211 as a second container. The process chamber 201 is formed when the upper container 210 is covering the lower container 211. The upper container 210 is made of a nonmetallic material such as aluminum oxide ($Al_2O_3$) or quartz ($SiO_2$), and the lower container 211 is made of, for example, aluminum (Al).

A gate valve 244 is installed on a lower side wall of the lower container 211. When the gate valve 244 is opened, a transfer mechanism (not shown) is used to load/unload the wafer 200 into/from the process chamber 201 through a loading/unloading port 245.

The process chamber 201 has a plasma generation space 201a around which a coil 212 is installed, and a substrate processing space 201b which is in communication with the plasma generation space 201a and in which the wafer 200 is processed. The plasma generation space 201a is a space where plasma is generated, and refers to a space above a lower end of the coil 212 and below an upper end of the coil 212 in the process chamber. On the other hand, the substrate processing space 201b is a space in which a substrate is processed using plasma, and refers to a space below the lower end of the coil 212. In the present embodiment, the plasma generation space 201a and the substrate processing space 201b have substantially the same diameter in the horizontal direction.

(Susceptor)

A susceptor 217 as a substrate mounting stand (substrate mounting part) on which the wafer 200 is held is disposed at the center of a bottom of the process chamber 201. The susceptor 217 is made of a non-metallic material such as aluminum nitride (AlN), ceramics, quartz or the like.

A heater 217b as a heating mechanism is integrally embedded in the susceptor 217. The heater 217b is configured to be able to heat the surface of the wafer 200 when power is supplied thereto.

The susceptor 217 is electrically isolated from the lower container 211. An impedance adjustment electrode 217c is installed inside the susceptor 217 in order to further improve uniformity of a density of plasma generated on the wafer 200 held on the susceptor 217, and is grounded via an impedance-varying mechanism 275. The impedance-varying mechanism 275 includes a coil and a variable capacitor, and is configured to be able to control an inductance and a resistance of the coil and a capacitance of the variable capacitor so as to change the impedance within a range from about 0Ω to a parasitic impedance value of the process chamber 201. Thus, a potential (bias voltage) of the wafer 200 can be controlled through the impedance adjustment electrode 217c and the impedance-varying mechanism 275.

A susceptor elevation mechanism 268 including a drive mechanism for moving up or down the susceptor is installed in the susceptor 217. Further, the susceptor 217 is provided with through-holes 217 a, and wafer lift pins 266 are provided at the bottom surface of the lower container 211. When the susceptor 217 is lowered by the susceptor elevation mechanism 268, the wafer lift pins 266 penetrate through the through-holes 217a without being in contact with the susceptor 217.

A substrate mounting part according to the present embodiment mainly includes the susceptor 217, the heater 217b and the electrode 217c.

(Gas Supply Part)

A gas supply head 236 is installed above the process chamber 201, that is, above the upper container 210. The gas supply head 236 includes a cap-shaped lid 233, a gas inlet 234, a buffer chamber 237, an opening 238, a shielding plate 240 and a gas outlet 239, and is configured to be able to supply a reaction gas into the process chamber 201. The buffer chamber 237 has a function as a dispersion space for dispersing the reaction gas introduced from the gas inlet 234.

The gas inlet 234 is connected with a gas supply pipe 232 at which a downstream end of an oxygen-containing gas supply pipe 232a for supplying an oxygen ($O_2$) gas as an oxygen-containing gas, a downstream end of a hydrogen-containing gas supply pipe 232b for supplying a hydrogen ($H_2$) gas as a hydrogen-containing gas, and an inert gas supply pipe 232c for supplying an argon (Ar) gas as an inert gas are joined. An $O_2$ gas supply source 250a, a mass flow controller (MFC) 252a as a flow rate control device, and a valve 253a as an opening/closing valve are installed at the oxygen-containing gas supply pipe 232a. An $H_2$ gas supply source 250b, an MFC 252b and a valve 253b are installed at the hydrogen-containing gas supply pipe 232b. An Ar gas supply source 250c, an MFC 252c and a valve 253c are installed at the inert gas supply pipe 232c. A valve 243a is installed at the downstream side where the oxygen-containing gas supply pipe 232a, the hydrogen-containing gas supply pipe 232b and the inert gas supply pipe 232c are joined, and is connected to the upstream end of the gas inlet 234. By opening and closing the valves 253a, 253b, 253c and 243a, processing gases such as the oxygen-containing gas, the hydrogen-containing gas and the inert gas can be supplied into the process chamber 201 via the gas supply pipes 232a, 232b and 232c while adjusting the flow rates of the respective gases by the MFCs 252a, 252b and 252c.

A gas supply part (a gas supply system) according to the present embodiment mainly includes the gas supply head 236, the oxygen-containing gas supply pipe 232a, the hydrogen-containing gas supply pipe 232b, the inert gas supply pipe 232c, the MFCs 252a, 252b and 252c and the valves 253a, 253b, 253c and 243a.

In addition, an oxygen-containing gas supply system according to the present embodiment includes the gas supply head 236, the oxygen-containing gas supply pipe 232a, the MFC 252a and the valves 253a and 243a. Further, a hydrogen gas supply system according to the present embodiment includes the gas supply head 236, the hydrogen-containing gas supply pipe 232b, the MFC 252b and the valves 253b and 243a. Furthermore, an inert gas supply system according to the present embodiment includes the gas supply head 236, the inert gas supply pipe 232c, the MFC 252c and the valves 253c and 243a.

(Exhaust Part)

A gas exhaust port 235 for exhausting the reaction gas from an interior of the process chamber 201 is installed at a side wall of the lower container 211. The upstream end of a gas exhaust pipe 231 is connected to the gas exhaust port 235. An auto pressure controller (APC) 242 as a pressure regulator (a pressure regulation part), a valve 243b as an opening/closing valve, and a vacuum pump 246 as a vacuum exhaust device are installed in order from the upstream side at the gas exhaust pipe 231.

An exhaust part according to the present embodiment mainly includes the gas exhaust port 235, the gas exhaust pipe 231, the APC 242 and the valve 243b. The exhaust part may include the vacuum pump 246.

(Plasma Generation Part)

A spiral resonance coil 212 as a first electrode is installed at an outer peripheral portion of the process chamber 201, that is, an outside of a side wall of the upper container 210 so as to surround the process chamber 201. The resonance coil 212 is connected with an RF sensor 272, a high-frequency power supply 273 and a matching device 274 for matching an impedance and an output frequency of the high-frequency power supply 273.

The high-frequency power supply 273 is configured to supply high-frequency power (RF power) to the resonance coil 212. The RF sensor 272 is installed at an output side of the high-frequency power supply 273 and configured to monitor information of a traveling wave and a reflected wave of the supplied high-frequency power. A reflected wave power monitored by the RF sensor 272 is input to the matching device 274, and the matching device 274 is configured to control the impedance of the high-frequency power supply 273 and the frequency of the output high-frequency power based on the information of the reflected wave input from the RF sensor 272 so that the reflected wave is minimized.

The high-frequency power supply 273 includes a power supply control means (control circuit) including a high-frequency oscillation circuit and a preamplifier for defining an oscillation frequency and an output, and an amplifier (output circuit) for amplifying the output to a predetermined output. The power supply control means controls the amplifier based on output conditions on a frequency and power preset through an operation panel. The amplifier supplies constant high-frequency power to the resonance coil 212 via a transmission line.

A winding diameter, a winding pitch, and the number of turns of the resonance coil 212 are set so as to resonate at a constant wavelength in order to form a standing wave having a predetermined wavelength. That is, the electrical length of the resonance coil 212 is set to a length corresponding to an integral multiple of one wavelength at a predetermined frequency of the high-frequency power supplied from the high-frequency power supply 273.

Specifically, in consideration of the applied power, an intensity of a generated magnetic field, an outer shape of a device to be applied, and the like, the resonance coil 212 has an effective sectional area of 50 to 300 mm$^2$ and a coil diameter of 200 to 500 mm so that a magnetic field of about 0.01 to 10 Gauss can be generated by high-frequency power of 800 kHz to 50 MHz and 0.5 to 5 KW, for example, and is wound about 2 to 60 times around an outer periphery of a room forming the plasma generation space 201a.

In the present embodiment, the frequency of the high-frequency power is set to 27.12 MHz, and the electrical length of the resonance coil 212 is set to one-wavelength length (about 11 meters). The winding pitch of the resonance coil 212 is set, for example, at equal intervals of 24.5 mm. Further, the winding diameter of the resonance coil 212 is set to be larger than the diameter of the wafer 200. In the present embodiment, the diameter of the wafer 200 is set to 300 mm, and the winding diameter of the resonance coil 212 is set to be 500 mm, which is larger than the diameter of the wafer 200.

Both ends of the resonance coil 212 are electrically grounded, and at least one end thereof is grounded via a movable tap 213 in order to finely adjust the electrical length of the resonance coil. Reference numeral 214 in FIG. 1 denotes the other fixed ground. A position of the movable tap 213 is adjusted so that the resonance characteristics of the resonance coil 212 are substantially equal to those of the high-frequency power supply 273. Further, in order to finely adjust the impedance of the resonance coil 212, a power feeder is configured by the movable tap 215 between the grounded both ends of the resonance coil 212.

A shielding plate 223 is installed to shield an outer electric field of the resonance coil 212 and to form a capacitance component (C component) necessary for forming a resonance circuit between the shielding plate 223 and the resonance coil 212. The shielding plate 223 is generally made of a conductive material such as an aluminum alloy and is formed in a cylindrical shape.

A plasma generation part (or a plasma generator) according to the present embodiment mainly includes the resonance coil 212, the RF sensor 272 and the matching device 274. The plasma generation part may include the high-frequency power supply 273.

Here, a principle of plasma generation of the apparatus according to the present embodiment and properties of the generated plasma will be described with reference to FIG. 2. The plasma generation circuit including the resonance coil 212 is configured as an RLC parallel resonance circuit. When the wavelength of the high-frequency power supplied from the high-frequency power supply 273 is equal to the electrical length of the resonance coil 212, a resonance condition of the resonance coil 212 is that the reactance component created by the capacitance component and the induction component of the resonance coil 212 is canceled out to become pure resistance. However, in the plasma generation circuit described above, when plasma is generated, an actual resonance frequency fluctuates slightly depending on fluctuation in capacitive coupling between a voltage portion of the resonance coil 212 and the plasma, fluctuation in inductive coupling between the plasma generation space 201a and the plasma, an excited state of the plasma, and the like.

Therefore, in the present embodiment, in order to compensate for a deviation of resonance in the resonance coil 212 when the plasma is generated, the power of the reflected wave from the resonance coil 212 when the plasma is generated is detected by the RF sensor 272, and the matching device 274 has a function of correcting the output of the high-frequency power supply 273 based on the reflected power of the reflected wave.

Specifically, based on the reflected wave power from the resonance coil 212, detected by the RF sensor 272 when the plasma is generated, the matching device 274 increases or decreases the impedance or the output frequency of the high-frequency power supply 273 such that the reflected wave power is minimized. When controlling the impedance, the matching device 274 includes a variable capacitor control circuit that corrects preset impedance. When controlling the frequency, the matching device 274 includes a frequency control circuit that corrects a preset oscillation frequency of the high-frequency power supply 273. The high-frequency power supply 273 and the matching device 274 may be integrally formed.

Figure 2:
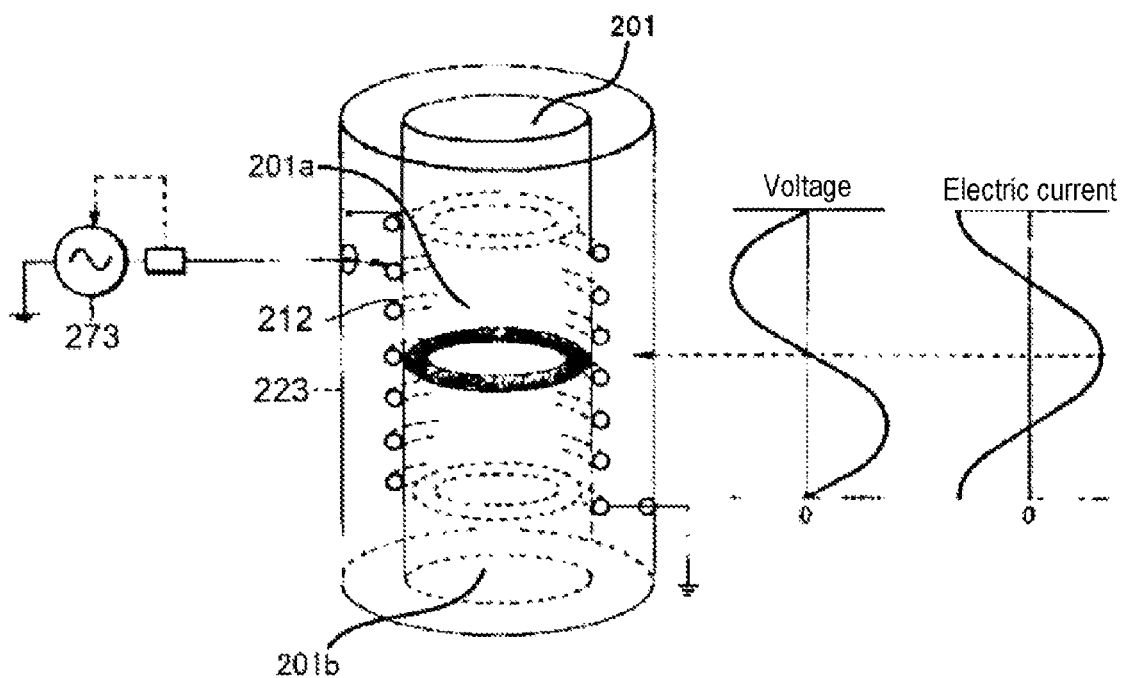
FIG. 2 is an explanatory view for explaining a principle of plasma generation of a substrate processing apparatus according to an embodiment of the present disclosure.

With this configuration, in the resonance coil 212 of the present embodiment, as illustrated in FIG. 2, since the high-frequency power by the actual resonance frequency of the resonance coil including the plasma is supplied (or since the high-frequency power is supplied so as to match the actual impedance of the resonance coil including the plasma is supplied), a standing wave in which a phase voltage and an anti-phase voltage are always canceled out is formed. When the electrical length of the resonance coil 212 is equal to the wavelength of the high-frequency power, the highest phase current is generated at an electrical midpoint of the coil (a node where the voltage is zero). Therefore, in the vicinity of the electric midpoint, there is almost no capacitive coupling with the process chamber wall and the susceptor 217, and doughnut-shaped induction plasma having an extremely low electric potential is formed.

(Control Part)

A controller 221 as a control part is configured to control the APC 242, the valve 243b and the vacuum pump 246 through a signal line A, the susceptor elevation mechanism 268 through a signal line B, the heater power adjustment mechanism 276 and the impedance-varying mechanism 275 through a signal line C, the gate valve 244 through a signal line D, the RF sensor 272, the high-frequency power supply 273 and the matching device 274 through a signal line E, and the MFCs 252a to 252c and the valves 253a to 253c and 243a through a signal line F, respectively.

Figure 3:
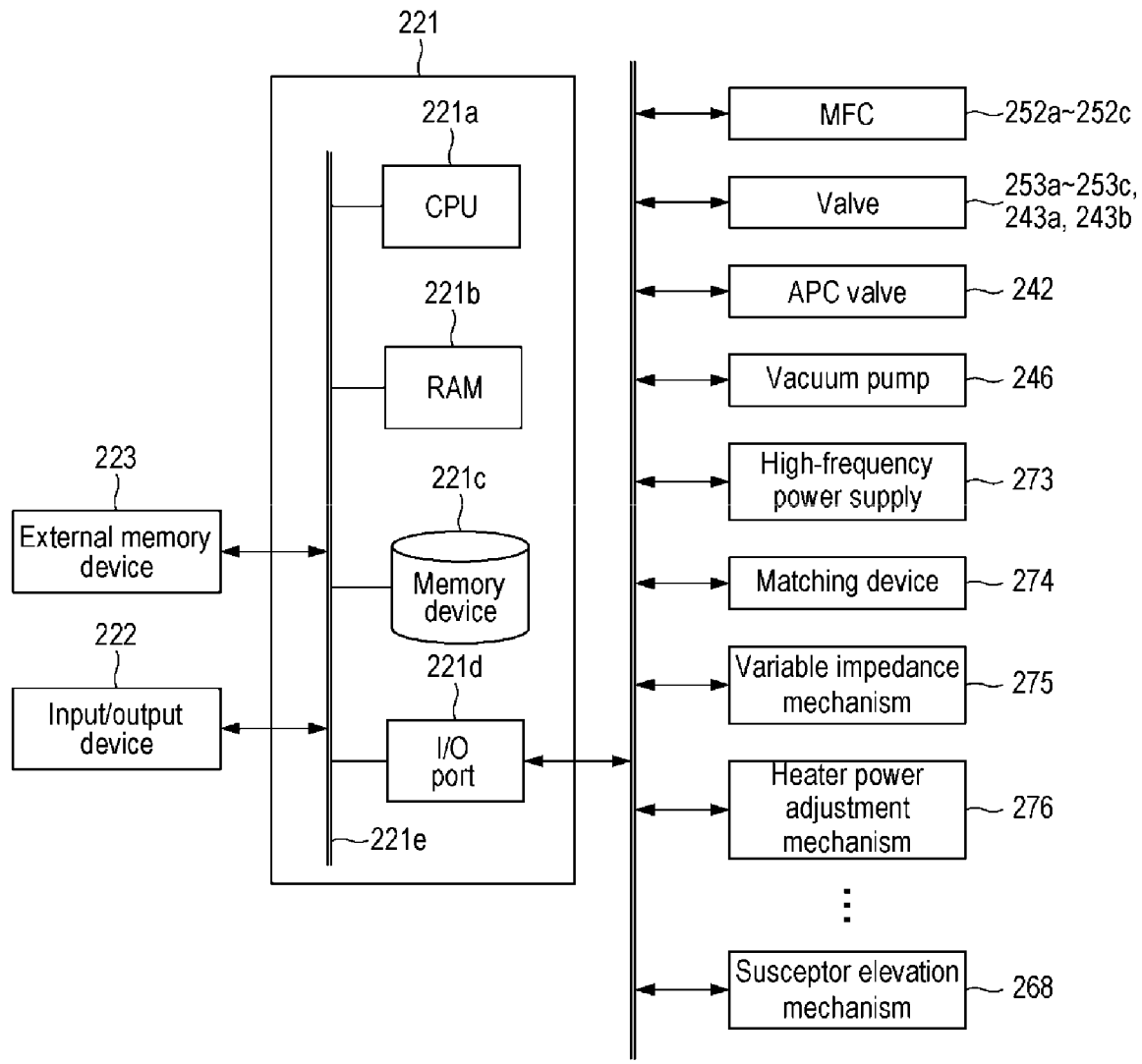
FIG. 3 is a view for explaining a control device according to an embodiment of the present disclosure.

As illustrated in FIG. 3, the controller 221, which is the control part (control means), is configured as a computer including a central processing unit (CPU) 221a, a random access memory (RAM) 221b, a storage device 221c and an I/O port 221d. The RAM 221b, the storage device 221c and the I/O port 221d are configured to be able to exchange data with the CPU 221a via an internal bus 221e. An input/output device 222 including, for example, a touch panel, a display or the like is connected to the controller 221.

The storage device 221c includes, for example, a flash memory, a hard disk drive (HDD) or the like. A control program for controlling an operation of the substrate processing apparatus, a program recipe in which procedures, conditions, and the like of substrate processing to be described later are written, and the like are readably stored in the storage device 221c. A process recipe is combined to obtain a predetermined result by causing the controller 221 to execute the respective procedures in the substrate processing process to be described later, and functions as a program. Hereinafter, the program recipe, the control program, and the like are collectively referred to simply as a program. In the present disclosure, the term "program" may include only a program recipe, only a control program, or both. Further, the RAM 221b is configured as a memory area in which programs, data and the like read by the CPU 221a are temporarily held.

The I/O port 221d is connected to the MFCs 252a to 252c, the valves 253a to 253c, 243a and 243b, the gate valve 244, the APC valve 242, the vacuum pump 246, the RF sensor 272, the high-frequency power supply 273, the matching device 274, the susceptor elevation mechanism 268, the impedance-varying mechanism 275, the heater power adjustment mechanism 276 and the like.

The CPU 221a is configured to read and execute the control program from the storage device 221c and to read the process recipe from the storage device 221c in response to an input of an operation command from the input/output device 222, and the like. Then, the CPU 221a is configured to control an opening degree adjustment operation of the APC valve 242, an opening/closing operation of the valve 243b, and a start/stop of the vacuum pump 246 through the I/O port 221d and the signal line A, an elevating operation of the susceptor elevation mechanism 268 through the signal line B, an adjustment operation of an amount of power supplied to the heater 217b (a temperature adjustment operation) by the heater power adjustment mechanism 276 and an impedance value adjustment operation by the impedance-varying mechanism 275 through the signal line C, an opening/closing operation of the gate valve 244 through the signal line D, operations of the RF sensor 272, the matching device 274, and the high-frequency power supply 273 through the signal line E, a flow rate adjustment operation of various gases by the MFCs 252a to 252c and an opening/closing operation of the valves 253a to 253c and 243a through the signal line F, and so on according to the contents of the read process recipes.

The controller 221 can be configured by installing, in a computer, the above-mentioned program stored in an external storage device (for example, a magnetic tape, a magnetic disk such as a flexible disk or a hard disk, an optical disk such as a CD or a DVD, a magneto-optical disk such as an MO, or a semiconductor memory such as a USB memory or a memory card) 223. The storage device 221c and the external storage device 223 are configured as a computer-readable recording medium. Hereinafter, these are collectively referred to simply as a recording medium. In the present disclosure, when the term "recording medium" is used, it may include the storage device 221c alone, the external storage device 223 alone, or both. A communication means such as the Internet or a dedicated line may be used to supply the program to the computer without using the external storage device 223.

(2) Substrate Processing Process

Figure 4:
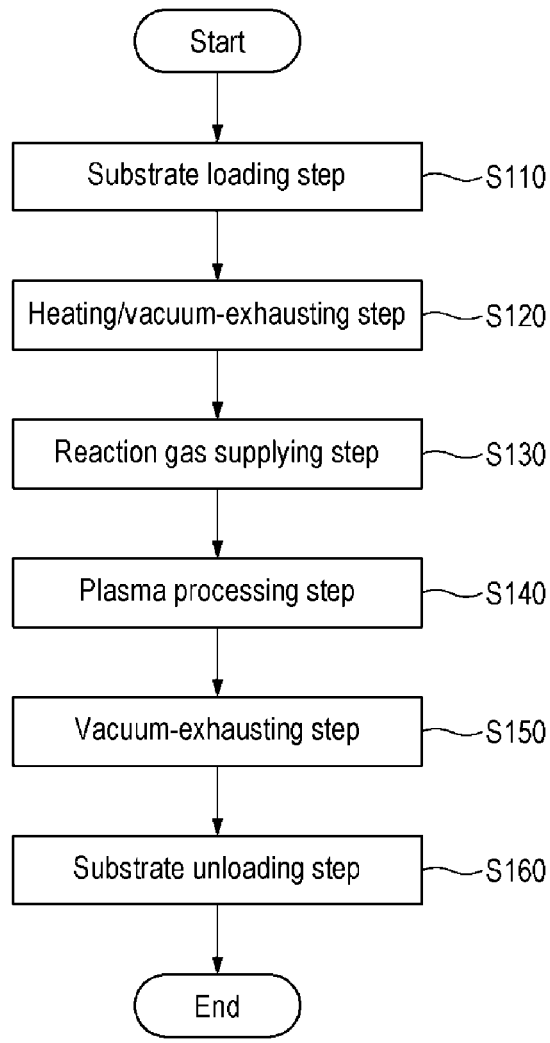
FIG. 4 is a flow chart showing a substrate processing process according to an embodiment of the present disclosure.

Next, a substrate processing process according to the present embodiment will be described mainly with reference to a flowchart illustrated in FIG. 4. The substrate processing process according to the present embodiment is performed as one of processes of manufacturing a semiconductor device such as a memory cell of a flash memory, or the like. This substrate processing process is performed by the processing apparatus 100. In the following description, operations of various parts of the processing apparatus 100 are controlled by the controller 221.

In the following plasma modifying steps (S110 to S160), which correspond to the substrate processing process according to the present embodiment, a plasma modifying process (a plasma annealing process) is performed on a wafer 200 (substrate) having at least a metal film constituting a gate electrode and the like, exposed on a surface of the wafer 200. In the present embodiment, the metal film is a tungsten (W) film.

In addition, in the present embodiment, together with the metal film, a silicon oxide film ($SiO_2$ film) constituting an insulating film and the like is formed on the wafer 200 so as to be exposed on the surface of the wafer 200. In the following plasma modifying process, an oxidizing/repairing process for improving a quality of the $SiO_2$ film as an oxide film is also performed at the same time with the process of modifying the metal film.

In the present embodiment, the W film and the $SiO_2$ film are stacked on the wafer 200, and a through-hole is formed from an upper surface of the stacked film by an etching process or the like. The W film and the $SiO_2$ film have a structure where these films are exposed inside the through-hole.

Further, in the present embodiment, the W film is a film formed on the wafer 200 by a CVD method using a tungsten hexafluoride ($WF_6$) gas as a precursor gas and an $H_2$ gas or the like as a reducing gas (in this case, including any of simultaneous supply and alternate supply of the precursor gas and the reducing agent). Generally, a metal film formed by a CVD method has a good step coverage for a complicated device structure compared with a metal film formed by a method such as a sputtering method, but also has a disadvantage that components (for example, fluorine (F), H and the like) contained in the precursor gas and the reducing gas are much contained as impurities in the film. The Impurities in this film may be one factor of increase in the sheet resistance of the metal film. Further, impurities contained in an etching gas or the like may be introduced into an exposed layer inside the through-hole of the W film by an etching process.

Similarly, the surface of the $SiO_2$ film exposed to the inside of the through-hole in this embodiment is damaged (physically roughened) by the etching process, and the impurities contained in the etching gas or the like are introduced into the exposed surface layer, which is one of the issues.

Further, in the present embodiment, reactive species such as radicals and non-accelerated ions, which will be described later, are generated by induction plasma having an extremely low electric potential, which is formed by the above-described plasma generation part. Therefore, a modified film having a good step coverage can be formed not only when a device such as a memory cell has a planar shape, but also when the device has a more complicated three-dimensional structure having a larger aspect ratio as in the present embodiment.

(Substrate Loading Step (Substrate Preparing Step) S110)

First, the wafer 200 with the W film and the $SiO_2$ film exposed on the surface of the wafer 200 is loaded (prepared) into the process chamber 201. Specifically, the susceptor elevation mechanism 268 lowers the susceptor 217 to a transfer position of the wafer 200, so that the wafer lift pins 266 protrude from the surface of the susceptor 217 by a predetermined height. Subsequently, the gate valve 244 is opened, and the wafer 200 is loaded into the process chamber 201 from a vacuum transfer chamber adjacent to the process chamber 201 and is held on the wafer lift pins 266 protruding from the surface of the susceptor 217. Then, the gate valve 244 is closed to seal the interior of the process chamber 201, and the susceptor elevation mechanism 268 raises the susceptor 217 so as to be at a predetermined position between the lower end of the resonance coil 212 and the upper end 245*a* of the loading/unloading port 245. As a result, the wafer 200 is supported on the upper surface of the susceptor 217.

(Heating/Vacuum-Exhausting Step S120)

Next, the temperature of the wafer 200 loaded into the process chamber 201 is increased. The heater 217*b* is heated in advance. When the loaded wafer 200 is held on the susceptor 217 in which the heater 217*b* is embedded, the wafer 200 is heated to a predetermined value within a range from, for example, room temperature (25 degrees C.) to 900 degrees C. The processing temperature of the wafer 200 may be as high as possible for the purpose of further improving an effect of modifying the W film and the $SiO_2$ film. In the present embodiment, the processing temperature is a predetermined value in a range of 600 to 900 degrees C., particularly 700 degrees C. or higher. If the processing temperature is lower than 600 degrees C., an effect of increase in the crystal grain size of the W film, which will be described later and an effect of oxidizing/repairing the $SiO_2$ film may not be sufficiently obtained. If the processing temperature exceeds 900 degrees C., unintended oxidation of the W film may occur. When the processing temperature is set to 600 to 900 degrees C., these effects can be sufficiently obtained, and the possibility of unintended oxidation of the W film can be avoided.

However, when it is necessary to suppress thermal damage to a device pattern formed on the wafer 200, the processing temperature of the wafer 200 may be a temperature high enough to generate plasma stably, specifically 150 degrees C. or higher. In the present embodiment, the wafer 200 is heated to a temperature of 700 degrees C.

In the present disclosure, a numerical range such as "600 to 900 degrees C." means that a lower limit and an upper limit are included in the range. Therefore, for example, "600 to 900 degrees C." means "600 degrees or higher and 900 degrees C. or lower." The same applies to other numerical ranges.

While the wafer 200 is being heated, the interior of the process chamber 201 is vacuum-exhausted by the vacuum pump 246 through the gas exhaust pipe 231. The vacuum pump 246 is operated at least until a substrate unloading step S160 to be described later is ended.

(Reaction Gas Supplying Step S130)

Next, supply of an $O_2$ gas and an $H_2$ gas as reaction gases (processing gases) is started. First, the valves 253*a* and 253*b* are opened, and a mixed gas of the $O_2$ gas and the $H_2$ gas is introduced (supplied) into the process chamber 201 via the buffer chamber 237. At this time, the MFCs 252*a* and 252*b* are controlled such that a total flow rate of the mixed gas of the $O_2$ gas and the $H_2$ gas and a flow rate ratio (a mixing ratio) of the $O_2$ gas and the $H_2$ gas become predetermined values.

In the present embodiment, the total flow rate of the mixed gas is 1000 sccm, and the flow rate ratio of the $H_2$ gas to the total flow rate of both gases is a predetermined ratio in a range of 20% to 100%. If the flow rate ratio of the $H_2$ gas is less than 20%, oxidation of the W film proceeds in the plasma processing process, and the sheet resistance of the W film increases. Further, in order to perform an oxidizing/modifying process on the $SiO_2$ film at an effective rate, the flow rate ratio of the $H_2$ gas may be 90% or less in some embodiments. As will be described later, in the present embodiment, under a condition that the flow rate ratio of the $H_2$ gas is in a range of 40% to 70%, an effect of improving the characteristics particularly by enlarging the crystal grain size of the W film is noticeable. Therefore, particularly, the flow rate ratio of the $H_2$ gas may be a predetermined ratio in the range. When the flow rate ratio of the $H_2$ gas is in the range of 40% to 70%, the oxidizing/modifying process on the $SiO_2$ film can be performed at a higher rate. In the present embodiment, a content ratio (a concentration ratio) of hydrogen (H) and oxygen (O) contained in the mixed gas that is the reaction gas is equal to the above-mentioned gas flow ratio.

Before the supply of the mixed gas, an $H_2$ gas may be introduced into the process chamber 201 so that the internal pressure of the process chamber 201 is adjusted to a predetermined pressure. This makes it possible to suppress the occurrence of oxidation of the W film while maintaining the internal pressure of the process chamber 201 when the supply of the mixed gas is started.

It has been illustrated in the present embodiment that only the $O_2$ gas and the $H_2$ gas are supplied as reaction gases into the process chamber 201. However, an Ar gas, which is an inert gas, may be simultaneously introduced, and a mixed gas of the $O_2$ gas, the $H_2$ gas and the Ar gas may be supplied. Even in this case, a ratio of H and O contained in the mixed gas is as described above.

The opening degree of the APC valve 242 is adjusted so that the internal pressure of the process chamber 201 after the supply of the mixed gas is a predetermined pressure, for example, 50 Pa to 250 Pa (120 Pa in the present embodiment).

(Plasma Processing Step S140)

(a) Reactive Species Generating Step (Process)

After the lapse of a predetermined time (for example, a few seconds) after the introduction of the mixed gas is started, the application of high-frequency power to the resonance coil 212 from the high-frequency power supply 273 via the matching device 272 is started. In the present embodiment, high-frequency power of 27.12 MHz and 1.5 kW is supplied from the high-frequency power supply 273 to the resonance coil 212. The magnitude of the high-frequency power is set to a predetermined value in a range of 100 to 5,000 W. As a result, a high-frequency electric field is formed in the plasma generation space 201*a*, and excites doughnut-shaped induction plasma at a height corresponding to the electrical midpoint of the resonance coil 212 in the plasma generation space. The $O_2$ gas and $H_2$ gas in plasma are dissociated to generate oxygen active species (oxygen radicals, O*), hydroxyl active species (hydroxyl radicals, OH*), hydrogen active species (hydrogen radicals, H*), and reactive species such as oxygen ions, hydrogen ions and the like.

As described above, a standing wave in which a phase voltage and an anti-phase voltage are always canceled out is formed, and the highest phase current is generated at the electrical midpoint of the coil (a node where the voltage is zero). Accordingly, the induction plasma excited at the electric midpoint has little capacitive coupling with the wall of the process chamber 201 or the susceptor 217, and doughnut-shaped plasma having an extremely low electric potential can be formed in the plasma generation space 201*a*.

Further, as described above, the power supply control means attached to the high-frequency power supply 273 compensates for the deviation of the resonance point in the resonance coil 212 due to the fluctuation of capacitive coupling or inductive coupling of the plasma, and forms the standing wave more accurately. Therefore, plasma having little capacitive coupling and an extremely low electric potential can be more reliably formed in the plasma generation space 201*a*.

Since plasma having an extremely low electric potential is generated, generation of a sheath on the wall of the plasma generation space 201a or on the susceptor 217 can be prevented. Therefore, ions in the plasma are not accelerated.

The application of the high-frequency power to the resonance coil 212 continues for a predetermined time in a range of, for example, 10 to 600 seconds (180 seconds in the present embodiment), during which the above-described reactive species are generated.

(b) Modifying Step (Process)

Then, the above-described reactive species generated by the plasma excitation of the mixed gas of the $H_2$ gas and the $O_2$ gas are supplied to the W film and the $SiO_2$ film formed on the surface of the wafer 200, and a plasma process (modifying process) is performed on the wafer 200.

Specifically, radicals such as O*, OH*, H* and the like and non-accelerated ions are uniformly supplied to the surfaces of the W film and the $SiO_2$ film on the wafer 200 held on the susceptor 217 in the substrate processing space 201b. Since the supplied radicals and ions are uniformly supplied to and react with the exposed surfaces of the W film and the $SiO_2$ film, even when the W film and the $SiO_2$ film form a complicated three-dimensional structure having a large aspect ratio, these films can be uniformly modified (for example, regardless of a depth or a direction of an opening of the structure, such as a through-hole). That is, a modified layer of the W film and the $SiO_2$ film having an excellent step coverage can be formed. Further, since an ion attack due to acceleration can be prevented, wafer damage due to ions can be suppressed.

<Effect of Modification on W Film>

The W film supplied with the reactive species on the exposed surface thereof is modified from the surface layer side to form a W modified layer. Specifically, the supplied reactive species reacts with the W film, whereby the W film is modified so as to increase a size of crystal grain (a grain size) of W constituting the W film. As the crystal grain size increases, electrons generally flow more easily through the film. That is, the sheet resistance value of the W film is reduced as the W crystal grain size increases.

In the plasma process in the present embodiment, a cycle is repeated in which W constituting the film is oxidized to $WO_x$ by reactive species containing O, and then $WO_x$ is reduced by reactive species containing H to become W again. At this time, it is presumed that the atoms of W are linked to each other to increase the grain size. That is, it is presumed that both O and H components contained in the processing gas in the present embodiment contribute to the increase in the W crystal grain size.

Figure 5A:
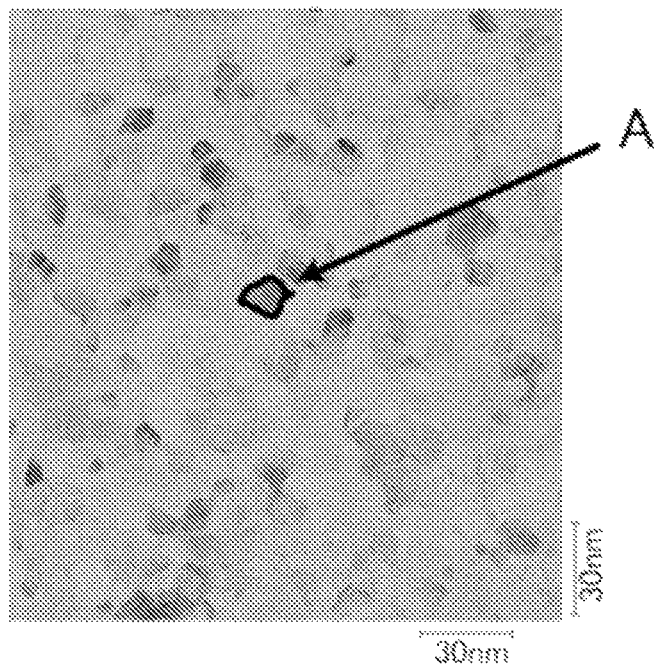
FIG. 5A is a photograph view showing a crystal state of a metal film surface captured before a plasma process according to an embodiment of the present disclosure is performed.
Figure 5B:
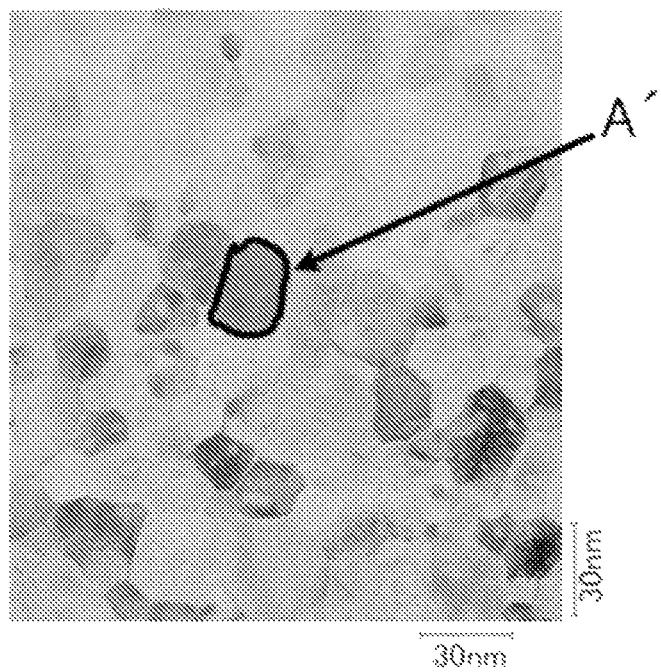
FIG. 5B is a photograph view showing a crystal state of a metal film surface captured after a plasma process according to an embodiment of the present disclosure is performed.

The effect of actually increasing the crystal grain size in the W film will be described with reference to FIGS. 5A and 5B. FIG. 5A is a photograph view of a crystal state (grain shape) of the surface of the W film before the plasma process in the present embodiment is performed, taken from the top side using a transmission electron microscope (TEM). In this photograph, one crystal grain surrounded by a thick line is shown as a crystal grain A. FIG. 5B is a photograph view of the crystal state of the surface of the W film after the plasma process in the present embodiment is performed, taken from top side using the TEM. In this photograph, the state (grain shape) of the crystal grain A after the plasma process is shown as a crystal grain A' surrounded by a thick line. As is clear from the comparison between the sizes of the crystal grains A and A', it is understood that the W film has been modified to increase the crystal grain size of the W film by the plasma process of the present embodiment.

In addition, as described above, when the W film contains a large amount of impurities, H* and the like contained in the reactive species enter the film, and an effect of removing the impurities from the film is expected. Further, it is expected that a crystal grain boundary is reduced as the crystal grain size of the W film increases, and that the impurities unevenly distributed in the crystal grain boundary are effectively removed. Therefore, when the plasma process in the present embodiment is performed, it is presumed that the effect of reducing the sheet resistance value of the W film due to a plurality of factors such as increase in the crystal grain size of the W film and removal of impurities in the W film can be obtained.

<Effect of Modification on $SiO_2$ Film>

The $SiO_2$ film supplied with the reactive species on the exposed surface thereof is modified from the surface layer side to form a modified layer of $SiO_2$. Specifically, the supplied reactive species react with the $SiO_2$ film to remove the impurities contained in the $SiO_2$ film and complement (i.e., oxidize) defects in a molecular structure of the $SiO_2$ film by the O atoms contained in the reactive species. That is, through the plasma process in the present embodiment, the impurities contained in the $SiO_2$ film are removed, and the surface layer damaged by an etching process or the like is repaired to improve the film properties of the $SiO_2$ film (for example, characteristics as an insulating film, etc.).

Then, when the above-mentioned predetermined time (180 seconds) elapses, the output of the power from the high-frequency power supply 273 is stopped, and the plasma discharge in the process chamber 201 is stopped. Further, the valves 243a, 253a and 253b are closed, and the supply of the $O_2$ gas and the $H_2$ gas into the process chamber 201 is stopped. Thus, the plasma processing step S140 is ended.

(Vacuum-Exhausting Step S150)

When the supply of the $O_2$ gas and the $H_2$ gas is stopped after a predetermined processing time has elapsed, the interior of the process chamber 201 is vacuum-exhausted. Thus, the $O_2$ gas and the $H_2$ gas in the process chamber 201 and other exhaust gas generated in the plasma modifying process are exhausted to the outside of the process chamber 201. Thereafter, the opening degree of the APC valve 242 is adjusted to adjust the internal pressure of the process chamber 201 to the same pressure (for example, 100 Pa) as the vacuum transfer chamber adjacent to the process chamber 201.

(Substrate Unloading Step S160)

When the internal pressure of the process chamber 201 reaches a predetermined pressure, the susceptor 217 is lowered to the transfer position of the wafer 200, and the wafer 200 is supported on the wafer lift pins 266. Then, the gate valve 244 is opened, and the wafer 200 is unloaded from the process chamber 201. Thus, the substrate processing process according to the present embodiment is completed.

(3) Effects According to the Present Embodiment

Hereinafter, the effect of modification on the W film in the present embodiment will be described in detail based on experimental results shown in FIGS. 6 to 9.

Experimental Example 1

FIG. 6 is a table showing minimum values, maximum values and average values of W crystal grain sizes in a W film in a state (A) where the plasma process according to the present embodiment is not performed and in a W film subjected to the plasma process with the flow rate ratio of $H_2$ gas in the reaction gas is (B) 100%, (C) 80% and (D) 65% in the plasma process according to the present embodiment.

As can be seen from FIG. 6, for any one of minimum values, maximum values and average values of W crystal grain sizes in the example of (C) in which the $H_2$ gas flow ratio in the reaction gas is 80% and the example of (D) in which the $H_2$ gas flow rate ratio is 65%, the W crystal grain size is larger than that in the example of (A) in which no plasma process is performed and in the example of (B) in which the $H_2$ gas flow rate ratio in the reaction gas is 100%.

That is, from the results of these experimental examples, it can be said that, in the plasma process according to the present embodiment, the effect of increasing the W crystal grain size is greater when O is contained in the reaction gas than when the $H_2$ gas flow rate ratio in the reaction gas is 100% (that is, when the reaction gas does not contain O)

It can be further seen from the experimental example shown in FIG. 6 that, for any of the minimum values, maximum values and average values of W crystal grain sizes, the effect of increasing the W crystal grain size is larger in the experimental example of (D) in which the $H_2$ gas flow rate ratio in the reaction gas is 65% than that in the experimental example of (C) in which the $H_2$ gas flow rate ratio is 80%. That is, such an effect increases as the O content ratio in the reaction gas increases from 0%. However, in order to obtain the effect of increasing the W crystal grain size in the plasma process according to the present embodiment, it is important to balance the oxidation reaction by the O-containing reactive species and the reduction reaction by the H-containing reactive species. If the O content ratio in the reaction gas is too large, the oxidation reaction by the O-containing reactive species becomes excessive to increase the sheet resistance value of the W film. Considering a tendency of the sheet resistance value shown in FIG. 7 to be described later, the O content ratio may be about 60% or less.

Experimental Example 2

Figure 7:
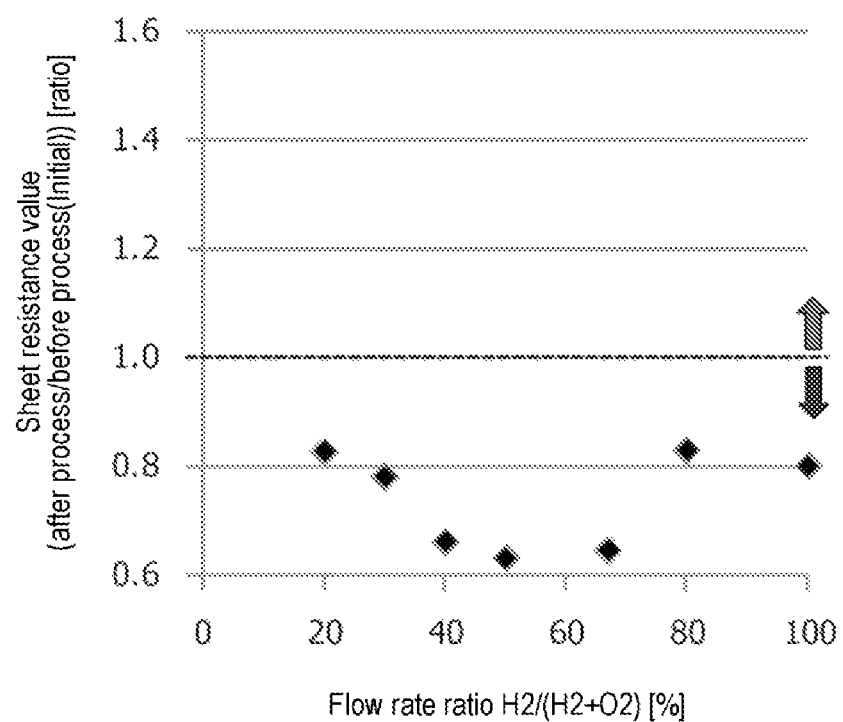
FIG. 7 is a view showing a relationship between a flow rate ratio of $H_2$ gas in a reaction gas and an amount of change a sheet resistance value of a W film before and after a modifying process in an experimental example according to the present disclosure.

FIG. 7 illustrates the sheet resistance value of the W film (a ratio of change in the sheet resistance value of the W film before and after the plasma process) when the plasma process is executed at each flow rate ratio while changing the $H_2$ gas flow rate ratio in the reaction gas (processing gas) in a range of 20 to 100% in the reaction gas supplying step S130 of the present embodiment. That is, when the sheet resistance value of the W film does not change, the value on the vertical axis is 1.0. When the value is less than 1.0, it indicates that the sheet resistance value is reduced. The process conditions other than the $H_2$ gas flow rate ratio are the same as those in the above-described embodiment.

As can be seen from FIG. 7, as a result of performing the plasma process in the present embodiment, when the $H_2$ gas flow rate ratio in the reaction gas is in the range of 20 to 100%, the sheet resistance values of the W film are all smaller than those before the plasma process.

Further, in the present experimental example, it is confirmed that the sheet resistance value of the W film is smaller when the $H_2$ gas flow rate ratio is in a range of 40 to 70% than when the $H_2$ gas flow rate ratio is 100% (that is, when the $O_2$ gas is not supplied). That is, in order to further reduce the sheet resistance value of the W film, it can be said that a reaction gas containing an $O_2$ gas in a range of 30 to 60% with the $H_2$ gas flow rate ratio set to be in the range of 40 to 70%, instead of only the $H_2$ gas containing no $O_2$ gas as the reaction gas, may be used. In other words, when the content ratio of H and O in the processing gas is set to fall within a range of 40:60 to 70:30, the W film can be modified so that the sheet resistance value of the W film becomes smaller than that when the content ratio of H and O in the processing gas is 100:0. Here, when the $H_2$ gas flow rate ratio and the H content ratio are less than 40% or more than 70%, it is difficult to obtain a sheet resistance value reduction effect superior to that in a modifying process using an $H_2$ gas containing no O, that is, a processing gas having the H content ratio of 100%.

It is presumed that such a characteristic regarding the $H_2$ gas flow rate ratio in the present embodiment occurs since the effect of reducing the sheet resistance value of the W film in the present embodiment is obtained by a plurality of factors such as increase in the crystal grain size of the W film by the plasma process and removal of impurities in the W film. In particular, in the present embodiment, by performing the plasma process using the processing gas containing O, the crystal grain size of the W film is remarkably increased, and it is thought that the increase in the crystal grain size greatly contributes to the reduction of the sheet resistance value.

Other Experimental Examples

Figure 8:
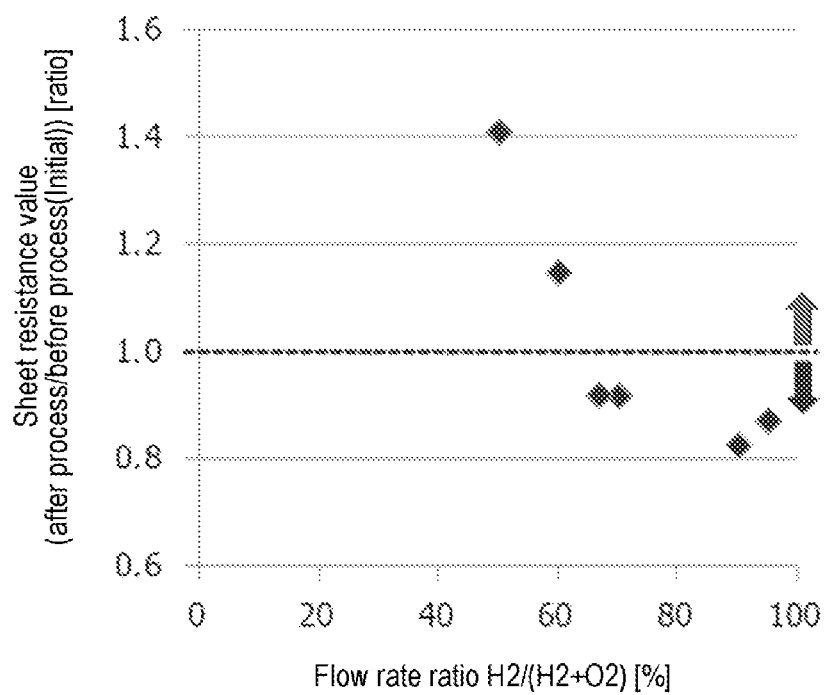
FIG. 8 is a view showing a relationship between a flow rate ratio of $H_2$ gas in a reaction gas and an amount of change in a sheet resistance value of a TiN film before and after a modifying process in another experimental example according to the present disclosure.

FIG. 8 illustrates the sheet resistance value of a TiN film (a ratio of change in the sheet resistance value of the TiN film before and after the plasma process) when the plasma process is executed on a wafer with a titanium nitride (TiN) film formed on the surface thereof at each $H_2$ flow rate ratio while changing the $H_2$ gas flow rate ratio in the reaction gas in a range of 50 to 95% in the reaction gas supplying step S130 of the present embodiment.

As can be seen from the experimental example shown in FIG. 8, as a result of performing the same plasma process as that of the present embodiment, when the $H_2$ gas flow rate ratio in the reaction gas is in a range of 65 to 95%, the sheet resistance value of the TiN film is smaller than that before the plasma process.

On the other hand, in the experimental example shown in FIG. 8, as compared with the experimental example 2 in which the W film is modified, it can be seen that the effect of further reducing the sheet resistance value by containing not only H but also O in the reaction gas is not obtained or is very small. In particular, when the $H_2$ gas flow rate ratio in the reaction gas is in a range of 60% or less, the sheet resistance value of the TiN film is significantly larger than that before the plasma process. Therefore, it can be said that the plasma process using the O-containing reaction gas according to the present embodiment is particularly suitable for the modifying process for the W film.

Other Embodiments of the Present Disclosure

In the first embodiment, a mixed gas of $H_2$ gas and $O_2$ gas is used as a reaction gas containing H and O. However, other hydrogen-containing gases (for example, an $NH_3$ gas and the like) may be used instead of the $H_2$ gas, and other oxygen-containing gases (for example, an NO gas and the like) may be used instead of the $O_2$ gas. In this case, the content ratio (concentration ratio) of H and O contained in the reaction gas is the same as the flow rate ratio of the $H_2$ gas and the $O_2$ gas in the first embodiment. Further, as the reaction gas containing H and O, a gas of a compound having H and O in one molecule (for example, an $H_2O$ gas, an $H_2O_2$ gas or the like) may be used. However, in that the ratio of H and O in the reaction gas can be easily adjusted by adjusting the supply flow rate ratio of the gas, a mixed gas of gas containing H and gas containing O as a reaction gas may be used.

In the first embodiment, the plasma process is applied to the W film as a metal film to be modified to reduce the sheet resistance value. The same plasma process may apply to a metal film composed of a single metal element such as titanium (Ti), ruthenium (Ru), molybdenum (Mo) or the like. That is, the same plasma process as in the first embodiment is expected to provide the effect of reducing the sheet resistance value by increase in the crystal grain size.

The above-described embodiments may apply to a process of manufacturing devices such as a DRAM, a flash memory and the like. Further, the above-described embodiments may apply to a process of manufacturing a NAND flash memory, which is a kind of flash memory, for example, a three-dimensional NAND flash memory (3D-NAND).

According to the present disclosure, it is possible to provide a technique of modifying a metal film composed of a single metal element formed on a substrate so as to significantly reduce a sheet resistance value of the metal film, such that the metal film has excellent characteristics applicable to an electrode and the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
preparing the substrate with a silicon-containing film and a metal film exposed on a surface of the substrate, the metal film being composed of a metal element, which includes at least one selected from the group of tungsten, titanium, ruthenium, and molybdenum; and
simultaneously performing modifying the metal film and modifying the silicon-containing film by supplying reactive species, which are generated by plasma-exciting a processing gas containing hydrogen and oxygen, to the substrate.

2. The method of claim 1, wherein in the act of modifying the metal film, the metal film is modified such that a crystal grain size of the metal element constituting the metal film is larger than that before performing the act of modifying the metal film.

3. The method of claim 1, wherein a content ratio of the hydrogen and the oxygen of the processing gas is a predetermined value in a range of 40:60 to 70:30.

4. The method of claim 1, wherein the act of modifying the silicon-containing film is oxidizing the silicon-containing film.

5. The method of claim 1, wherein the metal film is a metal film composed of a single metal element.

6. The method of claim 1, wherein the silicon-containing film is a silicon oxide film.

7. The method of claim 1, wherein in the act of modifying the metal film, a reactive species containing the oxygen reacts with the metal element such that the metal element is oxidized and the oxidized metal element reacts with a reactive species containing the hydrogen such that the oxygen is reduced.

8. The method of claim 1, wherein in the act of modifying the metal film, a reactive species containing the oxygen reacts with the metal element such that the metal element is oxidized and then the oxidized metal element reacts with a reactive species containing the hydrogen such that the oxygen is reduced, to thereby increase a crystal grain size of the metal element.

9. The method of claim 1, wherein in the act of simultaneously performing modifying the metal film and modifying the silicon-containing film, the substrate is heated to a predetermined temperature in a range of 600 to 900 degrees C.

10. The method of claim 1, wherein the processing gas is a mixed gas of hydrogen-containing gas and oxygen-containing gas.

11. The method of claim 1, wherein the processing gas is a mixed gas of hydrogen gas and oxygen gas.

12. The method of claim 1, wherein a flow rate ratio of the hydrogen in the processing gas is a predetermined ratio in a range of 20 to 100%.

13. The method of claim 1, wherein a flow rate ratio of the hydrogen in the processing gas is a predetermined ratio in a range of 40 to 70%.

14. The method of claim 1, wherein the act of simultaneously performing modifying the metal film and modifying the silicon-containing film is performed while supplying the processing gas.

15. The method of claim 1, wherein the act of simultaneously performing modifying the metal film and modifying the silicon-containing film includes a period in which the metal film and the silicon-containing film are performed simultaneously.

16. A method of manufacturing a semiconductor device comprising the method of claim 1.

17. A substrate processing apparatus executing the method of claim 1.

18. A non-transitory computer-readable recording medium storing a program that causes, by a computer, a substrate processing apparatus to perform a process comprising:
preparing a substrate with a silicon-containing film and a metal film exposed on a surface of the substrate, the metal film being composed of a metal element, which includes at least one selected from the group of tungsten, titanium, ruthenium, and molybdenum; and
simultaneously performing modifying the metal film and modifying the silicon-containing film by supplying reactive species, which are generated by plasma-exciting a processing gas containing hydrogen and oxygen, to the substrate.

* * * * *